United States Patent
Hoshikawa (10) Patent No.: US 11,683,923 B2
(45) Date of Patent: Jun. 20, 2023

(54) MAINTENANCE MANAGEMENT DEVICE

(71) Applicant: FUJI CORPORATION, Chiryu (JP)

(72) Inventor: Kazumi Hoshikawa, Toyohashi (JP)

(73) Assignee: FUJI CORPORATION, Chiryu (JP)

( * ) Notice: Subject to any disclaimer, the term of this patent is extended or adjusted under 35 U.S.C. 154(b) by 902 days.

(21) Appl. No.: 16/497,059

(22) PCT Filed: Mar. 30, 2017

(86) PCT No.: PCT/JP2017/013483
§ 371 (c)(1),
(2) Date: Sep. 24, 2019

(87) PCT Pub. No.: WO2018/179300
PCT Pub. Date: Oct. 4, 2018

(65) Prior Publication Data
US 2020/0383252 A1    Dec. 3, 2020

(51) Int. Cl.
*H05K 13/08*    (2006.01)
*H05K 13/04*    (2006.01)

(52) U.S. Cl.
CPC ....... *H05K 13/0895* (2018.08); *H05K 13/041* (2018.08); *H05K 13/087* (2018.08); *H05K 13/0409* (2018.08); *H05K 13/085* (2018.08)

(58) Field of Classification Search
CPC ............. H05K 13/087; H05K 13/0895; H05K 13/041; H05K 13/0409; H05K 13/085
See application file for complete search history.

(56) References Cited

U.S. PATENT DOCUMENTS

| | | | |
|---|---|---|---|
| 2005/0258381 A1* | 11/2005 | Kawase | H05K 13/0409 250/559.45 |
| 2015/0148934 A1* | 5/2015 | Maenishi | H05K 13/085 700/121 |
| 2016/0120081 A1 | 4/2016 | Hosaka et al. | |
| 2016/0158812 A1 | 6/2016 | Hoshikawa et al. | |

(Continued)

FOREIGN PATENT DOCUMENTS

| | | |
|---|---|---|
| EP | 2 838 332 A1 | 2/2015 |
| EP | 3 021 649 A1 | 5/2016 |

(Continued)

OTHER PUBLICATIONS

Jee Min Hong, Sung Han Lee and Beom Hee Lee, "A hierarchical optimization method in the PCB assembly for surface mounting machines," ISIE '97 Proceeding of the IEEE International Symposium on Industrial Electronics, 1997, pp. 129-134 vol.1, doi: 10.1109/ISIE.1997.651804. (Year: 1997).*

(Continued)

*Primary Examiner* — A. Dexter Tugbang
(74) *Attorney, Agent, or Firm* — Oblon, McClelland, Maier & Neustadt, L.L.P.

(57) ABSTRACT

A maintenance management device comprises: an inspection device configured to inspect an exchangeable element in a component mounting machine configured to mount a component on a circuit board; and an information management section configured to store statistical information in which results of multiple inspections with the inspection device are linked to identification information for each of multiple exchangeable elements targeted for inspection.

17 Claims, 8 Drawing Sheets

(56) References Cited

U.S. PATENT DOCUMENTS

2017/0217682 A1     8/2017    Hoshikawa et al.
2018/0249604 A1     8/2018    Komiyama et al.

FOREIGN PATENT DOCUMENTS

| JP | 2009-88570 A | 4/2009 | | |
| JP | WO 2013/153598 A1 | 10/2013 | | |
| JP | 2013-235921 A | 11/2013 | | |
| JP | WO 2014/196002 A1 | 12/2014 | | |
| JP | WO 2016/016929 A1 | 2/2016 | | |
| JP | WO 2017/033283 A1 | 3/2017 | | |
| JP | 2019197929 A | * | 11/2019 | .............. B25J 13/08 |
| WO | WO 2017/017788 A1 | 2/2017 | | |

OTHER PUBLICATIONS

International Search Report dated Jul. 4, 2017 in PCT/JP2017/013483 filed on Mar. 30, 2017.
Partial Supplementary European Search Report dated Feb. 27, 2020, in Patent Application No. 17903005.1, 14 pages.

* cited by examiner

Table 1: Various suction nozzle inspection results (MiN)

| Identification information (ID) | Inspection date/time | Inspection item (pass/fail) | | |
|---|---|---|---|---|
| | | External shape | Flow rate | Sliding resistance |
| Nx511 | d1:h1 | Sa20(○) | La20(○) | Ra20(○) |
| | d2:h1 | Sa19(○) | La19(○) | Ra19(○) |
| | d3:h1 | Sa18(○) | La18(○) | Ra18(○) |
| | ⋮ | ⋮ | ⋮ | ⋮ |
| Nx512 | d1:h2 | Sb25(NG) | Lb25(○) | Rb25(○) |
| | d2:h2 | Sb24(○) | Lb24(NG) | Rb24(NG) |
| | d3:h2 | Sb23(○) | Lb23(○) | Rb23(○) |
| | ⋮ | ⋮ | ⋮ | ⋮ |
| ⋮ | ⋮ | ⋮ | ⋮ | ⋮ |

Table 2: Suction nozzle statistical information (MsN)

| Identification information (ID) | Inspection item | Current value | | | Last N times | | All times | |
|---|---|---|---|---|---|---|---|---|
| | | Latest result | Passing rate | Recovery rate | Average value | Trend | Average value | Trend |
| Nx511 | External shape | Sa20(○) | 100 (%) | 99 (%) | NS01 | TN11 | AS01 | TA11 |
| | Flow rate | Ls20(○) | 100 (%) | 95 (%) | NL01 | TN12 | AL01 | TA12 |
| | Sliding resistance | Ra20(○) | 100 (%) | 92 (%) | NR01 | TN13 | AR01 | TA13 |
| Nx512 | External shape | Sb25(NG) | 96 (%) | 94 (%) | NS02 | TN21 | AS02 | TA21 |
| | Flow rate | Lb25(○) | 88 (%) | 95 (%) | NL02 | TN22 | AL02 | TA22 |
| | Sliding resistance | Rb25(○) | 91 (%) | 93 (%) | NR02 | TN23 | AR02 | TA23 |
| ⋮ | ⋮ | ⋮ | ⋮ | ⋮ | ⋮ | ⋮ | ⋮ | ⋮ |

Table 1: Various mounting head inspection results (MiH)

| Identification information (ID) | Inspection date/time | Inspection item (pass/fail) | | |
|---|---|---|---|---|
| | | Drive load | Negative pressure flow rate | Positive pressure flow rate |
| Hx621 | d4:h1 | DAa30(○) | Ma30(○) | Pa30(○) |
| | d5:h1 | DAa29(○) | Ma29(○) | Pa29(○) |
| | d6:h1 | DAa28(○) | Ma28(○) | Pa28(○) |
| | ⋮ | ⋮ | ⋮ | ⋮ |
| Hx622 | d4:h2 | DAb35(○) | Mb35(NG) | Pb35(○) |
| | d5:h2 | DAb34(NG) | Mb34(○) | Pb34(○) |
| | d6:h2 | DAb33(○) | Mb33(○) | Pb33(○) |
| | | | | |
| ⋮ | ⋮ | ⋮ | ⋮ | ⋮ |

Table 2: Mounting head statistical information (MsH)

| Identification information (ID) | Inspection item | Current value | | | Last N times | | All times | |
|---|---|---|---|---|---|---|---|---|
| | | Latest result | Passing rate | Recovery rate | Average value | Trend | Average value | Trend |
| Hx621 | Drive load | DAa30(○) | 100 (%) | 98 (%) | NDA01 | TN31 | ADA01 | TA31 |
| | Negative pressure flow rate | Ma30(○) | 100 (%) | 94 (%) | NM01 | TN32 | AM01 | TA32 |
| | Positive pressure flow rate | Pa30(○) | 100 (%) | 96 (%) | NP01 | TN33 | AP01 | TA33 |
| Hx622 | Drive load | DAb35(NG) | 87 (%) | 95 (%) | NDA02 | TN41 | ADA02 | TA41 |
| | Negative pressure flow rate | Mb35(○) | 96 (%) | 95 (%) | NM02 | TN42 | AM02 | TA42 |
| | Positive pressure flow rate | Pb35(○) | 98 (%) | 97 (%) | NP02 | TN43 | AP02 | TA43 |
| ⋮ | ⋮ | ⋮ | ⋮ | ⋮ | ⋮ | ⋮ | ⋮ | ⋮ |

Table 1: Various feeder inspection results (MiF)

| Identification information (ID) | Inspection date/time | Inspection item (pass/fail) | | |
|---|---|---|---|---|
| | | Operation accuracy | Drive load | Detection sensitivity |
| Fx841 | d7:h1 | Ca15(○) | DBa15(○) | Va15(○) |
| | d8:h1 | Ca14(○) | DBa14(○) | Va14(○) |
| | d9:h1 | Ca13(○) | DBa13(○) | Va13(○) |
| | : | : | : | : |
| Fx842 | d7:h2 | Cb20(NG) | DBb20(○) | Vb20(○) |
| | d8:h2 | Cb19(○) | DBb19(○) | Vb19(NG) |
| | d9:h2 | Cb18(○) | DBb18(NG) | Vb18(○) |
| : | : | : | : | : |

Table 2: Feeder statistical information (MsF)

| Identification information (ID) | Inspection item | Current value | | | Last N times | | All times | |
|---|---|---|---|---|---|---|---|---|
| | | Latest result | Passing rate | Recovery rate | Average value | Trend | Average value | Trend |
| Fx841 | Operation accuracy | Ca15(○) | 100 (%) | 100 (%) | NC01 | TN51 | AC01 | TA51 |
| | Drive load | DBa15(○) | 100 (%) | 98 (%) | NDB01 | TN52 | ADB01 | TA52 |
| | Detection sensitivity | Va15(○) | 100 (%) | 98 (%) | NV01 | TN53 | AV01 | TA53 |
| Fx842 | Operation accuracy | Cb20(NG) | 96 (%) | 98 (%) | NC02 | TN61 | AC02 | TA61 |
| | Drive load | DBb(○) | 96 (%) | 96 (%) | NDB02 | TN62 | ADB02 | TA62 |
| | Detection sensitivity | Vb20(○) | 96 (%) | 96 (%) | NV02 | TN63 | AV02 | TA63 |
| : | : | : | : | : | : | : | : | : |

MAINTENANCE MANAGEMENT DEVICE

TECHNICAL FIELD

The present specification relates to a maintenance management device.

BACKGROUND ART

As disclosed in Patent Literature 1, exchangeable elements, such as suction nozzles used in component mounting machines, are inspected by an inspection device for the purpose of maintaining proper performance or the like. Depending on the result of an inspection, an exchangeable element is subjected to maintenance procedures such as cleaning and repair. As a result, the occurrence of mounting errors caused by exchangeable elements in the mounting process of the component mounting machine is prevented.

PATENT LITERATURE

Patent Literature 1: WO 2016/016929

BRIEF SUMMARY

Technical Problem

However, exchangeable elements that have been serviced may be prone to performance degradation compared to new exchangeable elements or may not be adequately serviced thereby causing errors upon re-installation. In the mounting process of the component mounting machine, it is necessary to more reliably prevent the occurrence of mounting errors and suppress the lowering of production efficiency. It is an object of the present specification to provide a production management device which manages results of inspections by an inspection device as statistical information and uses the information for performing maintenance to maintain production efficiency.

Solution to Problem

A maintenance management device disclosed in this specification includes: an inspection device configured to inspect an exchangeable element in a component mounting machine configured to mount a component on a circuit board; and an information management section configured to store statistical information in which results of multiple inspections with the inspection device are linked with identification information for each of multiple exchangeable elements as a target for inspection.

Advantageous Effects

With such a configuration, the results of the inspections by the inspection device are stored as statistical information linked with identification information for the corresponding exchangeable element. Such statistical information is useful information that can be used for analyzing the performance level of the exchangeable element and analyzing trends of change in the performance level of the exchangeable element when identifying the cause of a mounting error. For example, when a trend of a change in the performance level of a certain exchangeable element is observed, it can be used as material for determining whether the exchangeable element should be allowed to be used for the mounting process. As a result, maintenance can be managed to maintain production efficiency.

DESCRIPTION OF EMBODIMENTS

1. Embodiment 1-1. Overview of Maintenance Management Device

The maintenance management device manages exchangeable elements in component mounting machines constituting a production line for producing various board products. In the above production line, the circuit board (hereinafter, simply referred to as "board") Bd is sequentially conveyed in the production devices, such as a component mounting machine, and a production process, such as a mounting process, is executed for each production device to produce a board product. Each of the multiple production devices is communicably connected to a host computer.

1-2. Configuration of Component Mounting Machine 10

Figure 1:
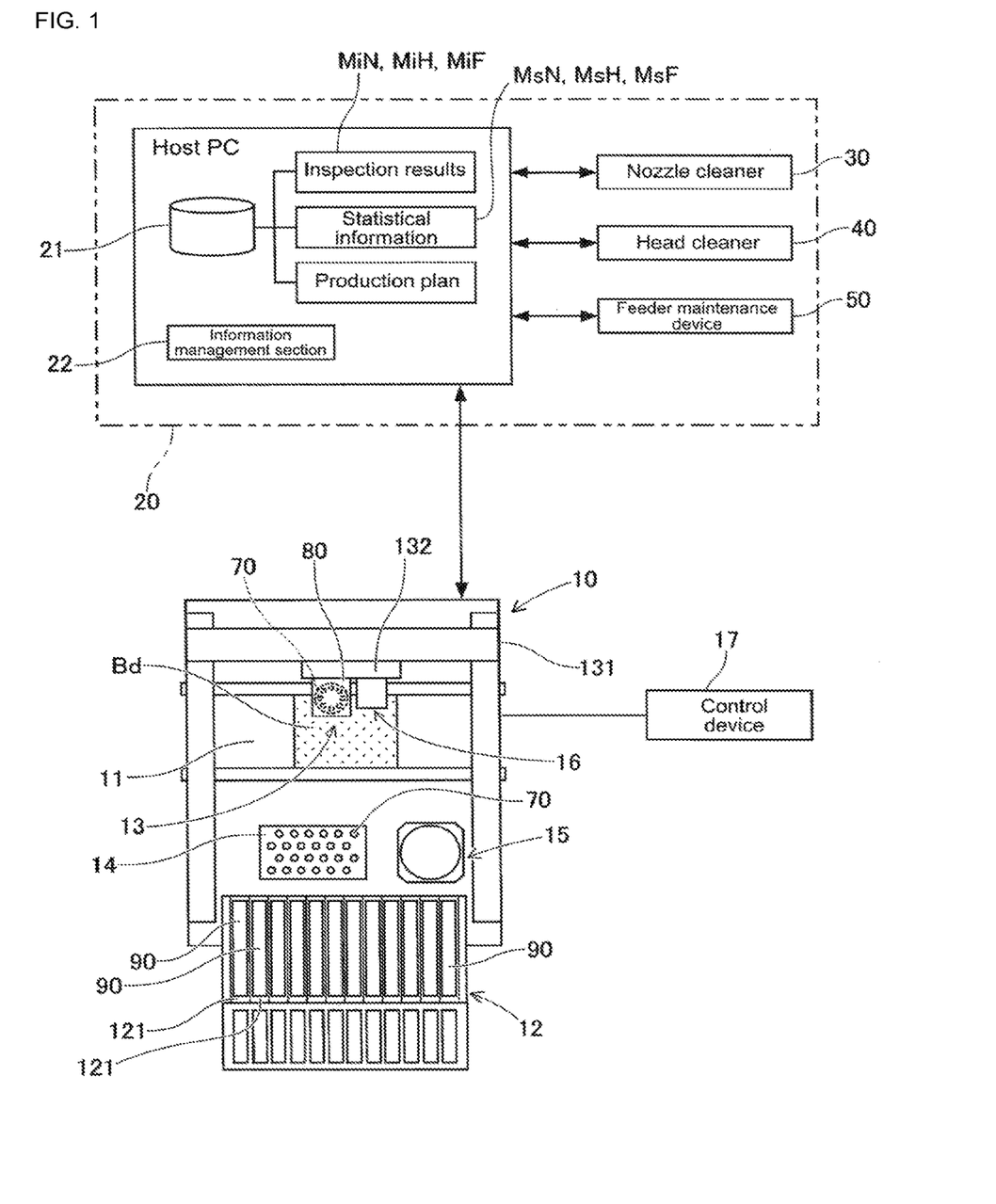
FIG. 1 shows a configuration of a component mounting machine and functional blocks of a maintenance management device according to an embodiment.

As shown in FIG. 1, component mounting machine 10 includes board conveyance device 11, component supply device 12, component transfer device 13, nozzle station 14, component camera 15, and board camera 16. Board conveyance device 11 is configured by a belt conveyor or the like and conveys boards Bd sequentially in the conveyance direction. Board conveyance device 11 conveys boards Bd into component mounting machine 10, and positions boards Bd at predetermined positions inside the machine. After a mounting process of a component by component mounting machine 10 is completed, board conveyance device 11 carries out the substrate Bd to the outside of component mounting machine 10.

Component supply device 12 supplies components to be mounted on board Bd. Component supply device 12 has multiple slots 121 arranged side by side in the X-axis direction. Feeder 90 is set in each of the multiple slots 121 in an exchangeable manner. Feeder 90 is a tape feeder that feeds and moves carrier tape 95 containing a large number of components (see FIG. 9) to a feeding position located on the distal end of feeder 90 in a manner which allows components to be picked up. The configuration of feeder 90 will be described later.

Component transfer device 13 includes head driving device 131 and moving body 132. Head driving device 131 is configured to move moving body 132 in the X-axis direction and the Y-axis direction by a linear motion mechanism. Mounting head 80 is interchangeably fixed to moving body 132 by a clamp member (not shown). Mounting head 80 picks up components supplied by component supply device 12 and mounts the components at predetermined mounting positions of board Bd.

One or more suction nozzles 70 are detachably provided on mounting head 80. In the present embodiment, mounting head 80 is of a rotary type in which multiple suction nozzles 70 are held on a circumference centered on an R-axis parallel to the Z-axis. The configurations of suction nozzle 70 and mounting head 80 will be described later. Nozzle station 14 holds multiple suction nozzles 70 in an orientation in which nozzle shaft 73 is directed downward. Nozzle station 14 is detachably installed on a base of component mounting machine 10.

Component camera 15 and board camera 16 are digital imaging devices having imaging elements such as a CCD (Charge Coupled Device) or a CMOS (Complementary Metal Oxide Semiconductor). Component camera 15 and board camera 16 perform imaging based on a control signal input from the outside. Component camera 15 and board camera 16 transmit image data acquired by imaging.

Component camera 15 is fixed to the base of component mounting machine 10 so that the optical axis thereof faces upward in the Z-axis direction. Component camera 15 is configured to image a component held by suction nozzle 70 from below. Board camera 16 is provided on moving body 132 of component transfer device 13 so that the optical axis faces downward in the Z-axis direction. Board camera 16 is configured to image board Bd from above.

Mounting control device 17 is mainly composed of a CPU, various types of memory, and a control circuit. In the mounting process for mounting a component on board Bd, mounting control device 17 receives information outputted from various sensors provided in component mounting machine 10 and recognition processing results by image processing or the like. Mounting control device 17 sends a control signal to component transfer device 13 based on a control program, predetermined mounting conditions, and the like. Thus, the position and the rotation angle of suction nozzle 70 supported by mounting head 80 are controlled.

1-3. Overview and Configuration of Maintenance Management Device 20

The performance of the exchangeable element in component mounting machine 10 having the above-described configuration needs to be properly maintained so that mounting errors do not occur in the mounting process by component mounting machine 10. Exchangeable elements in component mounting machine 10 are set in component mounting machine 10 so as to be exchangeable. Specifically, exchangeable elements include suction nozzle 70, mounting head 80, and feeder 90.

Further, nozzle station 14 holding multiple suction nozzles 70, nozzle tool 82 (see FIG. 6) exchangeably held by mounting head 80, and a tool station (not shown) holding the nozzle tool may be used as an exchangeable element. These exchangeable elements may be exchanged automatically by component mounting machine 10 or an external device in addition to being exchanged by manually by an operator. Maintenance management device 20 is intended to prevent the occurrence of a mounting error and maintain production efficiency by statistically assessing the state of exchangeable elements such as suction nozzle 70.

As shown in FIG. 1, maintenance management device 20 includes storage device 21, information management section 22, nozzle cleaner 30, head cleaner 40, and feeder maintenance device 50. In the present embodiment, storage device 21 and information management section 22 are incorporated in a host PC which monitors the operation state of the production line and manages the production line as a whole. Storage device 21 is configured by a hard disk, flash memory, or the like. Storage device 21 stores information such as inspection results of exchangeable elements (MiN, MiH, MiF), statistical information (MsN, MsH, MsF) generated based on the inspection results, and a production plan for the production line.

Information management section 22 stores, in storage device 21, statistical information (MsN, MsH, MsF) in which the results of multiple inspections by an inspection device are linked with identification information for each of multiple exchangeable elements, which were inspection targets. Updating of statistical information by information management section 22 will be described later. In the present embodiment, the inspections of exchangeable elements are performed by different multiple inspection devices depending on the type of exchangeable element. Specifically, the inspection devices are inspection units 32, 42, 52 (see FIGS. 3, 7, 10) incorporated in nozzle cleaner 30, head cleaner 40, and feeder maintenance device 50, respectively.

1-4. Configuration of Suction Nozzle 70

Figure 2:
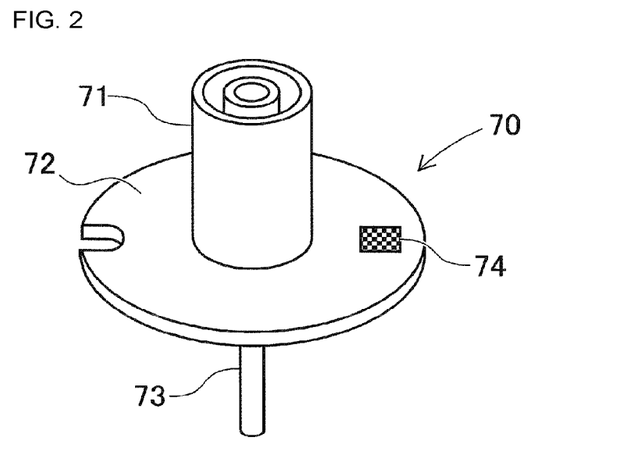
FIG. 2 is a perspective view showing a suction nozzle used in the component mounting machine.

As shown in FIG. 2, suction nozzle 70 has body shaft 71 having a cylindrical shape. Body shaft 71 functions as a main body section held by mounting head 80. Disk-shaped flange 72 is formed at one end in the axial direction of body shaft 71, that is, on the lower side in FIG. 2. Suction nozzle 70 has nozzle shaft 73 having a tubular shape extending in the axial direction from body shaft 71. Body shaft 71 and nozzle shaft 73 form a negative pressure flow path in suction nozzle 70. Nozzle shaft 73 holds the component in contact with the tip portion by the negative pressure supplied through body shaft 71.

Further, nozzle shaft 73 is configured to extend and contract in the axial direction with respect to body shaft 71. More specifically, nozzle shaft 73 is biased in a direction extending from body shaft 71 by an elastic member (not shown). When a load is applied to the tip of nozzle shaft 73 toward body shaft 71, nozzle shaft 73 slides with respect to body shaft 71 and contracts against the elastic force of the above-mentioned elastic member in an expansion/contraction portion of suction nozzle 70 constituted by body shaft 71 and nozzle shaft 73. Identification code 74 is attached to the upper surface of flange 72. Identification code 74 includes unique information such as identification information (ID) and the type of suction nozzle 70.

1-5. Configuration of Nozzle Cleaner 30

As shown in FIG. 1, nozzle cleaner 30 is a device external to component mounting machine 10. In the present embodiment, nozzle cleaner 30 is a nozzle management device that loads nozzle station 14 in a state in which multiple suction nozzles 70 are held, and performs cleaning, inspection, and storage of suction nozzles 70.

Figure 3:
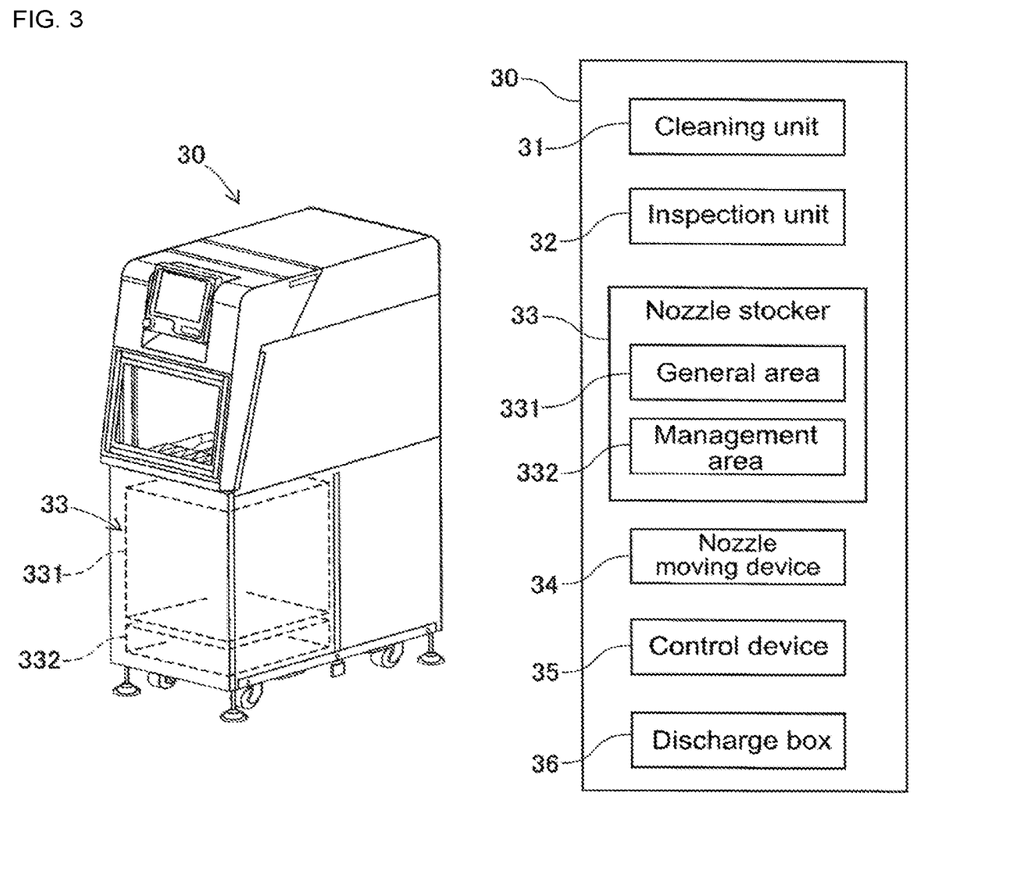
FIG. 3 is a view showing the appearance of a nozzle cleaner and a functional block diagram of the nozzle cleaner.

Further, nozzle cleaner 30 has a function of transferring stored suction nozzles 70 to nozzle station 14 in response to a request to support changeover at component mounting machine 10. As shown in FIG. 3, nozzle cleaner 30 includes cleaning unit 31, inspection unit 32, nozzle stocker 33, nozzle moving device 34, control device 35, and discharge box 36.

Cleaning unit 31 cleans the negative pressure flow path and the extending and retracting portion of suction nozzle 70. More specifically, cleaning unit 31 performs cleaning and drying of suction nozzle 70 in a cleaning chamber (not shown). In the cleaning process, for example, cleaning unit 31 flows a high pressure cleaning fluid (air, washing liquid) into the interior of suction nozzle 70 and also injects a cleaning fluid such as high pressure air or water onto the exterior surface of suction nozzle 70 for cleaning. Further, cleaning unit 31 performs a drying process in which moisture is blown off by a blowing device (not shown) to dry suction nozzle 70 on which the cleaning process has been performed.

Inspection unit 32 is an inspection device that performs various inspections on suction nozzle 70 in nozzle cleaner 30. In the present embodiment, the items of inspection by inspection unit 32 include the external shape of suction nozzle 70, the flow rate of the negative pressure flow path, and the sliding resistance of the extending and retracting portion, as shown in Table 1 of FIG. 4. More specifically, inspection unit 32 images, for example, suction nozzle 70 held by nozzle moving device 34 with a camera (not shown), and inspects the external shape of suction nozzle 70 based on image data acquired by the imaging. As a result, it is checked whether suction nozzle 70 is distorted, defective, or has foreign matter adhering to it.

Figure 4:
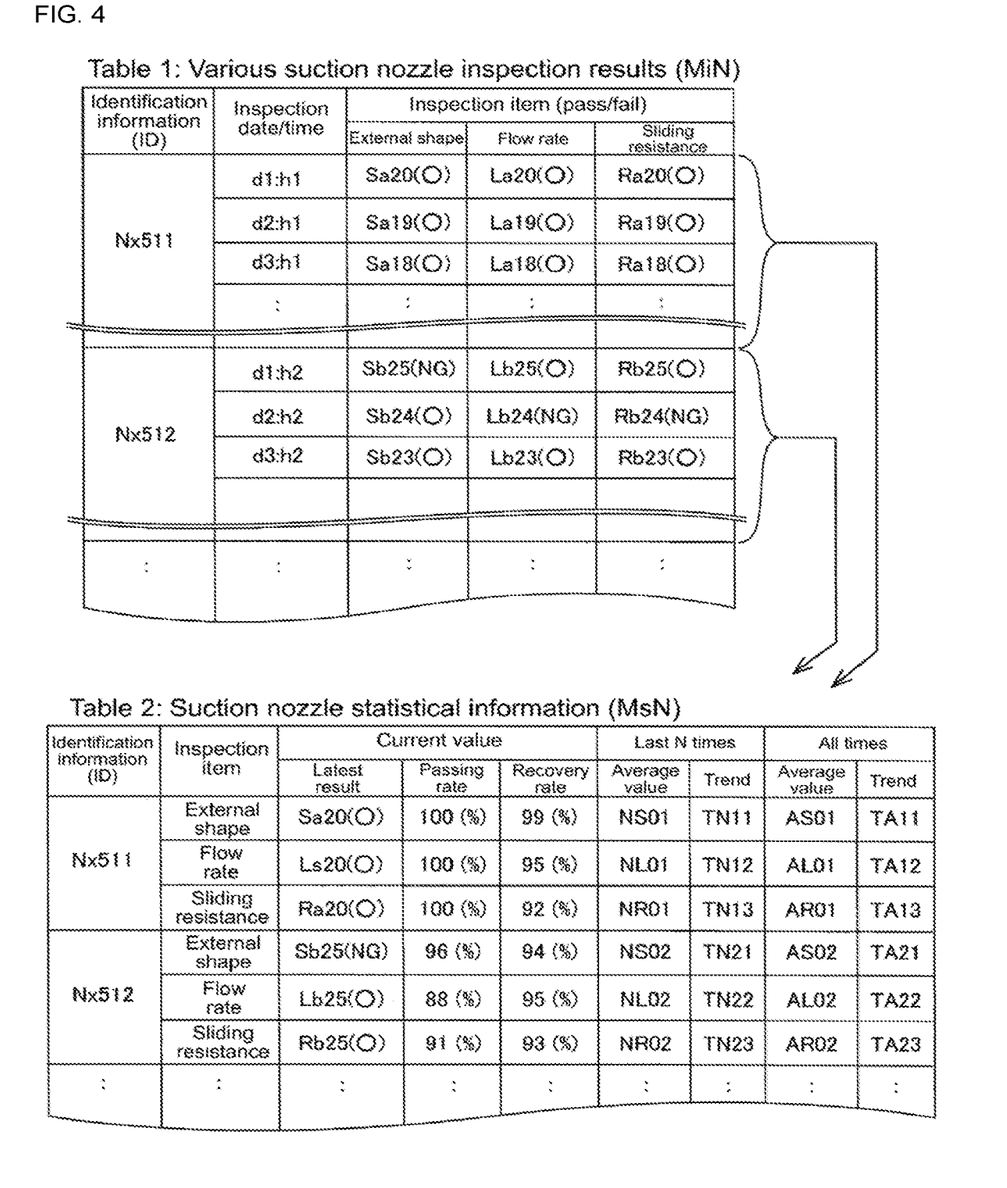
FIG. 4 is tables showing results of various inspections on suction nozzles and statistical information, in which the inspection results are linked with identification information of the suction nozzles.

Inspection unit 32 detects a load when nozzle shaft 73 of suction nozzle 70 slides toward the inside of body shaft 71 by using a load cell (not shown). It is assumed that the sliding resistance of suction nozzle 70 whose measured value by the load cell is larger than the prescribed value is increased due to factors such as contamination of the sliding portion. Inspection unit 32 makes a good-bad quality determination for each inspection and records the quality level in the determination result. Further, inspection unit 32 may perform an appropriate type of inspection on suction nozzle 70 cleaned by cleaning unit 31, and may perform a good-bad quality determination again.

More specifically, as shown in Table 1 of FIG. 4, inspection unit 32 records the inspection date and time (d1:h1, d2:h1, . . . ) and the measured values of the respective inspection items for each of piece of identification information (ID: Nx511, Nx512, . . . ) of suction nozzles 70 inspected. For example, the measured values (Sa20, Sa19, . . . ) of the contour of suction nozzles 70 indicate the degree of deformation relative to an ideal contour. Inspection unit 32 records the pass/fail result (O, NG) of each inspection item based on the measured value and pass/fail criteria. That is, each measured value indicates the quality level in the good-bad quality determination result for the various inspection items.

Nozzle stocker 33 is a storage unit configured to store multiple suction nozzles. Nozzle stocker 33 transfers suction nozzle 70 to a storage pallet (not shown) and accommodates each of multiple storage pallets in a different storage position. In the present embodiment, nozzle stocker 33 is provided with general area 331 from which an operator can take out suction nozzle 70, and management area 332 from which only an administrator having a predetermined authority can take out suction nozzle 70.

General area 331 of nozzle stocker 33 is an area in which the operator can access the storage pallet by opening the door of nozzle cleaner 30. On the other hand, management area 332 of nozzle stocker 33 is an area in which access to the storage pallet is restricted by, for example, a door with a key that can be unlocked by a key possessed by an administrator. Accordingly, nozzle stocker 33 is configured so that suction nozzle 70 stored in management area 332 cannot be freely removed by an operator.

Nozzle moving device 34 moves suction nozzle 70 between cleaning unit 31, inspection unit 32, nozzle stocker 33, the installation position of nozzle station 14, and discharge box 36. Nozzle moving device 34 includes a mechanism for holding suction nozzles 70 one by one with a holding chuck (not shown) and moving suction nozzles 70 in a three-dimensional direction. As a result, suction nozzle 70 is properly transferred between the pallet for the cleaning, inspection, and storage, and nozzle station 14.

Nozzle moving device 34 further includes a mechanism for moving the storage pallet to general area 331 or management area 332 of nozzle stocker 33. Nozzle moving device 34 is provided with a code reader (not shown) capable of reading identification code 74 of suction nozzle 70 and the identification code attached to nozzle station 14.

Control device 35 is a controller mainly composed of a CPU, various memories, and a control circuit. Control device 35 is communicably connected to a host computer, which is an external device, and is configured to share various types of information. Control device 35 controls various cleaning processes, various inspection processes, and storage processes including transferring of suction nozzle 70. Discharge box 36 accumulates suction nozzles 70 determined to be defective based on the inspection result of inspection unit 32, for example. Discharge box 36 is partitioned into multiple spaces, and is used, for example, for sorting according to the cause of the defect.

1-6 Maintenance Management Process of Maintenance Management Device 20

As shown in FIG. 1, information management section 22 of maintenance management device 20 stores statistical information or the like in which the results of multiple inspections by an inspection device (i.e., inspection unit 32 or the like) are linked with identification information for each of multiple exchangeable elements (i.e., suction nozzles 70 or the like). In the following description, it is assumed that the "exchangeable element" in the present embodiment is "suction nozzle 70" in order to simplify the description.

Information management section 22 generates or updates the statistical information MsN of suction nozzles 70 when multiple suction nozzles 70 are inspected by inspection unit 32 and MiN (see Table 1 in FIG. 4) is acquired or updated as results of the inspections. As a result, as shown in Table 2 of FIG. 4, the statistical information MsN statistically shows the results of inspections performed multiple times for each of the inspection items (external shape, flow rate, sliding resistance) corresponding to identification information (Nx511, Nx512, . . . ) of suction nozzles 70. As described above, the statistical information MsN can be used for various determinations and analyses to indicate the performance level of suction nozzles 70 which are exchangeable elements.

In the present embodiment, information management section 22 links a passing rate, indicating the ratio of passes to the number of executions of the quality determination with respect to suction nozzles 70, with the identification information for suction nozzle 70 and stores it as statistical information MsN. Suction nozzles 70 stored in nozzle cleaner 30 which fail the good-bad quality determination may pass upon doing the good-bad quality determination again after undergoing, for example, a predetermined cleaning process performed by cleaning unit 31.

Further, stored suction nozzles 70 may include those which have been approved for use after failing according to results of the good-bad quality determination, for example, after being repaired by the operator. Although suction nozzle 70 as described above is, in the current situation, approved for use in the mounting process, a record of having been determined as defective due to some cause in the past is stored. If the passing rate of suction nozzle 70 decreases, there is a high probability that suction nozzle 70 will be determined to be defective in subsequent inspections depending on the cause of the defect, in other words, it may cause a mounting error when suction nozzle 70 is used in the mounting process.

Therefore, information management section 22 approves or disapproves the use of suction nozzle 70 in the mounting process based on the passing rate of each inspection item of suction nozzle 70. For example, by excluding a suction nozzle 70 whose passing rate for a certain inspection item is lower than a threshold value from use in the mounting process, the occurrence of a mounting error can be prevented in advance. Further, unnecessary execution of the cleaning process can be avoided, thereby reducing management costs.

Further, in the present embodiment, information management section 22 stores a recovery rate of suction nozzle 70, indicating the proportion of recoveries of the current state with respect to a reference state, as statistical information MsN in association with identification information of suction nozzle 70, based on the quality level in the good-bad quality determination results of suction nozzle 70. Exchangeable elements, such as suction nozzles 70, are subjected to a cleaning process and an adjustment process every time they are used in a mounting process, for example, so that proper performance can be maintained. However, even if maintenance processes such as cleaning are performed, performance may not be completely restored.

Here, the "reference state" denotes a state in which the initial or ideal performance of the exchangeable element such as suction nozzle 70 is exhibited. That is, if the inspection item is the external shape of suction nozzle 70, the reference state corresponds to the ideal external shape of suction nozzle 70. If the inspection item is the flow rate in the negative pressure flow path of suction nozzle 70, the reference state corresponds to the flow rate according to a specification or flow rate upon being newly arrived. The recovery rate indicates to what extent the current state of suction nozzle 70 is recovered by maintenance, such as cleaning of the suction nozzle 70, to the reference state.

It is considered that, if the recovery rate of suction nozzle 70 decreases, there is a high probability that a recovery close to the reference state cannot be expected even if maintenance, such as a subsequent cleaning, is performed depending on the cause of the defect, in other words, suction nozzle 70 may cause a mounting error when used in the mounting process. Therefore, information management section 22 determines whether to approve or disapprove the use of suction nozzle 70 in the mounting process based on the recovery rate for each inspection item of suction nozzle 70. For example, by excluding suction nozzle 70 whose recovery rate for a certain inspection item is lower than a threshold value from use in the mounting process, the occurrence of a mounting error can be prevented in advance. Further, unnecessary execution of the cleaning process can be avoided, thereby reducing management costs.

Figure 5:
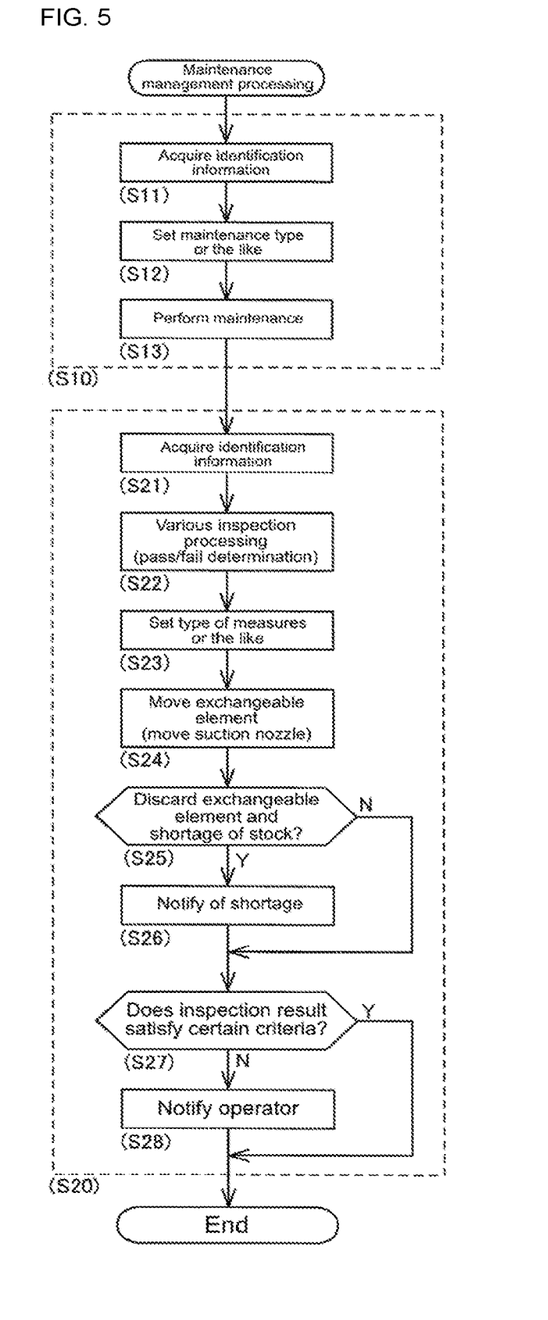
FIG. 5 is a flow chart showing a maintenance management process.

The maintenance management process by maintenance management device 20 will be described with reference to FIG. 5. The maintenance management process is executed, for example, when multiple suction nozzles 70 are loaded into nozzle cleaner 30 while being held by nozzle station 14. Here, it is assumed that an operation mode, which executes maintenance such as cleaning on loaded suction nozzles 70, has been selected for nozzle cleaner 30. Maintenance management device 20 first acquires identification information as a maintenance step (step 10 (hereinafter, step is referred to as "S")) (S11).

More specifically, information management section 22 acquires identification information from nozzle cleaner 30 as a result of nozzle cleaner 30 reading identification code 74 of suction nozzle 70 with the code reader. Next, information management section 22 sets the type, combination, and number of cleanings for suction nozzle 70 based on the statistical information MsN indicating the past inspection results linked to the read identification information (S12). Specifically, when the passing rate or the recovery rate of suction nozzle 70 is lower than a defined value, oil mist is set in the cleaning fluid, and the flow rate of the oil mist, the cleaning time, and the number of cleanings are set in accordance with the recovery rate or the like.

Next, nozzle cleaner 30 executes the maintenance set in S12 (S13). As a result, suction nozzle 70 performs maintenance such as cleaning based on the statistical information MsN. Further, nozzle cleaner 30 may set the maintenance types and the like for each of multiple suction nozzles 70 held in nozzle station 14 conveyed in (S12), and after sorting suction nozzles 70 into corresponding pallets, perform maintenance such as cleaning on suction nozzles 70 collectively (S13).

Next, maintenance management device 20 shifts to the inspection process (S20). Inspection unit 32 of nozzle cleaner 30 reads identification code 74 with the code reader and acquires identification information for the suction nozzle 70 targeted for inspection (S21). Inspection unit 32 then executes various inspection processes of the predetermined inspection items (i.e., external shape, flow rate, sliding resistance) (S22). As a result, inspection unit 32 records the measured value for each inspection item and determines whether each inspection item passes or fails (O, NG) based on the measured value and the pass/fail criteria.

The results MiN of the various inspections of suction nozzles 70 are updated by adding the measured values and determination results. Accordingly, the statistical information MsN of suction nozzle 70 is also updated in the same manner. Specifically, the current values of "latest result", "passing rate", and "recovery rate" are updated. Further, the "average value" and "trend" of the statistically processed measured values of only the last N inspection results and the "average value" and "trend" of the statistically processed measured values of all the inspection results are updated.

The "average value" is a value obtained by averaging the measured values. The "trend" is a value indicating the degree of change in the measured value. Specifically, to establish a "trend", information management section 22 may calculate the slope of a straight line obtained, for example, by approximating three or more measured values with the least squares method, or may calculate the slope of a tangent of the last measured value of a curve approximating three or more measured values.

Maintenance management device 20 sets the type of handling (e.g., storage, re-cleaning, repair, disposal) for suction nozzle 70 based on the pass/fail result of the inspection item of suction nozzle 70 (S23). Specifically, when suction nozzle 70 has passed all the inspection items, maintenance management device 20 stores suction nozzle 70 for use in the next mounting process (S23). Maintenance management device 20 transfers suction nozzle 70 to the corresponding pallet so that suction nozzle 70 is accommodated in general area 331 of nozzle stocker 33 (S24).

On the other hand, when suction nozzle 70 has not passed all the inspection items, maintenance management device 20 sets the type of handling, such as cleaning by cleaning unit 31 again, cleaning with an ultrasonic cleaning machine, repair by an operator, or disposal, to suction nozzle 70, based on the passing rate or the like (S23). More specifically, when the sliding resistance of the expansion and contraction section fails and the recovery rate is within a predetermined range up to the threshold value, maintenance management device 20 changes the cleaning fluid to the oil mist to execute the cleaning process again, or sets the type of handling so as to perform the cleaning with an ultrasonic cleaning machine.

On the other hand, when a defect is found in the external shape of suction nozzle 70 or when the difference in the recovery rate of the failed inspection item is over a predetermined value up to the threshold value, maintenance management device 20 sets the type of handling so as to cause the operator to repair or transfer suction nozzle 70 to a disposal box. Further, when, for example, the passing rate of the failed inspection item is lower than a second threshold value different from the threshold value for pass/fail determination, maintenance management device 20 transfers suction nozzle 70 to a corresponding pallet so that suction nozzle 70 is accommodated in management area 332 of nozzle stocker 33 (S24).

As described above, maintenance management device 20 accommodates the predetermined suction nozzle 70 in management area 332 to restrict suction nozzle 70 from being erroneously taken out and used for a subsequent mounting process. As described above, when suction nozzle 70 is moved from inspection unit 32 to nozzle stocker 33 by nozzle moving device 34, maintenance management device 20 exchanges general area 331 or management area 332 based on statistical information MsN relating to suction nozzle 70. In this way, suction nozzle 70 having a potential cause for a defect, being difficult to determine as defective from appearance, can be managed under predetermined authority based on statistical information MsN. Therefore, use of the defective suction nozzle 70 in a subsequent mounting process due to a misunderstanding of the operator can be prevented.

Subsequently, in S23, maintenance management device 20 determines that suction nozzle 70 is defective and is to be discarded (including storing in management area 332) and determines whether the number of suction nozzles 70 in stock of a type that can be substituted for suction nozzle 70 is less than a predetermined value (S25). Suction nozzles 70 are classified into various types according to the component type that is the pickup target and can be substituted for each other depending on the type. Suction nozzle 70 is discarded when a certain degree of deterioration progresses even after maintenance such as cleaning is performed. After doing so, it is necessary to secure a quantity of suction nozzles 70 necessary for subsequent mounting processes even when the number of discarded suction nozzles 70 reaches a predetermined value.

Therefore, when the number of suction nozzles 70 in stock of a type that can be substituted for suction nozzle 70 is less than a predetermined value (S25: Yes), maintenance management device 20 transmits information on the shortage of suction nozzles 70 (S26). Specifically, maintenance management device 20 transmits information including the type and quantity of the depleted suction nozzle 70 to, for example, an operator or a nearby warehouse storing suction nozzles 70 of a substitutable type. As a result, suction nozzle 70 is discharged from the warehouse in response to the shortage information, and the operator is guided to receive suction nozzle 70 in the warehouse. Further, the type of depleted suction nozzles 70 may be automatically ordered by using the above-mentioned shortage information.

Subsequently, when suction nozzle 70 has passed all the inspection items or when the number of suction nozzles 70 in stock of a type that can be substituted for suction nozzle 70 targeted for discarding is equal to or more than a predetermined value (S25: No), or after transmitting shortage information in S26, information management section 22 of maintenance management device 20 determines whether the inspection result for suction nozzle 70 in the statistical information MsN satisfies a certain criterion (S27). The above-mentioned "certain criterion" is a criterion for determining whether a notification is made as an inspection result, and is freely set by an operator or an administrator separately from the criterion for determining whether a measured value related to an inspection item passes or fails.

Specifically, as a certain criterion, a value indicating that the measured value is significantly lower than the assumed range, a value indicating that the measured value passes but the passing rate and the recovery rate are deteriorated, and a value indicating that suction nozzle 70 targeted for discarding is determined to be accommodated in management area 332 of nozzle stocker 33 can be set for each inspection item. When the result of an inspection of suction nozzle 70 in statistical information MsN does not satisfy a certain criterion (S27: No), information management section 22 notifies the operator of the corresponding part of the identification information and the statistical information MsN of suction nozzle 70 (S28).

In this way, the operator can receive notification based on statistical information MsN in addition to the pass/fail determination of the measured value related to an inspection item and acquire information of suction nozzle 70. Conventionally, it has been difficult to assess, for example, the deterioration trend of each suction nozzle 70 from accumulated information by simply accumulating the measured value with inspection unit 32. On the other hand, with the above-described configuration, the operator is alerted by the notification and can take measures such as making suction nozzle 70 subject to maintenance before it becomes defective.

Maintenance management device 20 executes the maintenance step (S10) and the inspection step (S20), as described above, and ends the maintenance management process. Further, suction nozzle 70 for which the handling is set to execute maintenance such as cleaning again in S23 is cleaned by cleaning unit 31 and inspection unit 32 determines again the good-bad quality of suction nozzle 70. Maintenance management device 20 further receives results of the re-inspection and updates the statistical information MsN. The maintenance management process is then executed in the same manner as described above.

As described above, maintenance management device 20 is configured to execute the maintenance process (S10) and the inspection process (S20) in order by selecting the operation mode for executing maintenance, such as cleaning, in the maintenance management process. On the other hand, after executing the inspection process related to at least one of the various inspection items (i.e., external shape, flow rate, sliding resistance, and the like) in the maintenance management process, maintenance management device 20 may set the type of handling (e.g., storage, cleaning, repair, disposal) based on the pass/fail result of the inspection and execute the maintenance step (S10) as necessary.

2. First Alternative embodiment 2-1. Overview of First Alternative Embodiment

In an embodiment above, a configuration in which an exchangeable element of component mounting machine 10 targeted by maintenance management device 20 is suction nozzle 70 was described as an example. On the other hand, the exchangeable element of component mounting machine 10 targeted by maintenance management device 20 may be mounting head 80. Hereinafter, a first alternative embodiment in which the exchangeable element is mounting head 80 will be described.

2-2. Configuration of Mounting Head 80

Figure 6:
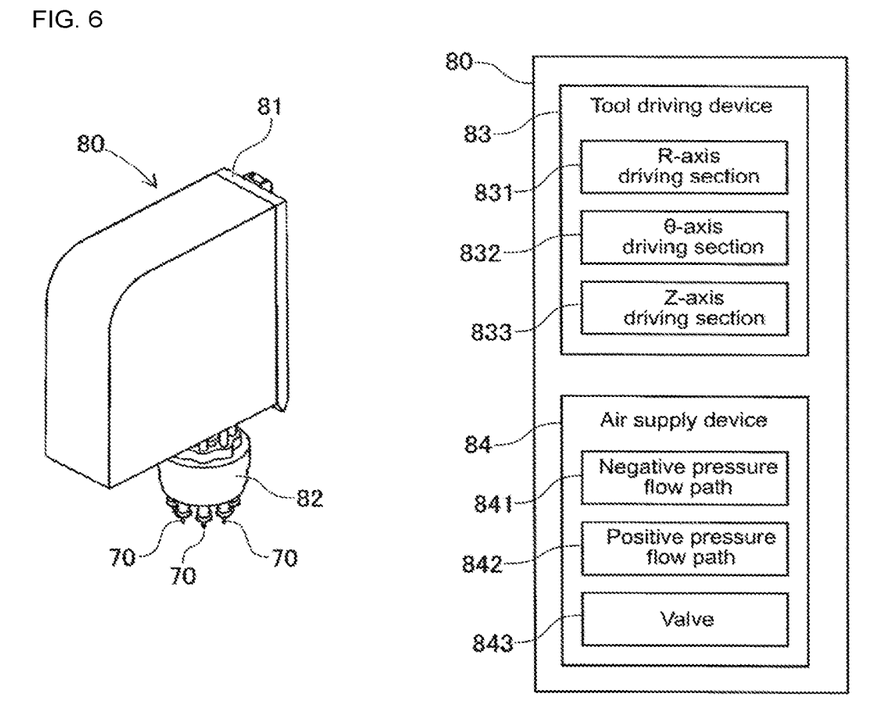
FIG. 6 is a view showing the appearance of a mounting head used in the component mounting machine and a functional block diagram of the mounting head.

As shown in FIG. 6, mounting head 80 has head main body 81 clamped to moving body 132 of component transfer device 13. Head main body 81 has nozzle tool 82, tool driving device 83, and air supply device 84. Nozzle tool 82 holds multiple suction nozzles 70 at equal intervals in a circumferential direction on a circumference concentric with the R-axis so as to be slidable in the Z-axis direction and rotatable around a θ axis. Mounting head 80 may have nozzle tool 82 which is of a detachable type or integrally fixed type. The θ axis is a rotation axis of suction nozzles 70 that is parallel to the R axis and passes through the shaft center of each suction nozzle 70.

Tool driving device 83 is composed of a motor, a speed reducer, a linear motion mechanism, and the like, and is angularly positioned around the θ axis of suction nozzle 70 and positioned in the Z-axis direction. Tool driving device 83 includes R-axis driving section 831, θ-axis driving section 832, and Z-axis driving section 833. R-axis driving section 831 rotates nozzle tool 82 around the R-axis with respect to head main body 81. θ-axis driving section 832 rotates each of multiple suction nozzles 70 around the θ-axis. Z-axis driving section 833 raises and lowers one of the multiple suction nozzles 70, which is indexed to a predetermined position in head main body 81, in the Z-axis direction.

Air supply device 84 generates a negative pressure or a positive pressure with an air pump (not shown) and supplies the negative pressure or the positive pressure to suction nozzle 70 via an air flow path formed inside mounting head 80. Air supply device 84 has negative pressure passage 841, positive pressure passage 842, and valve 843. Negative pressure flow path 841 is an air flow path used when negative pressure is supplied to suction nozzle 70. Positive pressure flow path 842 is an air flow path used when positive pressure is supplied to suction nozzle 70. Valve 843 is operated by, for example, a stepping motor (not shown) and switches between the supply of negative pressure, the supply of positive pressure, and cutting off of the air flow path.

2-3. Configuration of Head Cleaner 40

As shown in FIG. 1, head cleaner 40 is a device external to component mounting machine 10. In the present embodiment, head cleaner 40 is a head management device that loads mounting head 80 and performs cleaning and inspection of mounting head 80. When mounting head 80 is attached by a clamp mechanism, head cleaner 40 is in a state in which tool driving device 83 of mounting head 80 is operated and air or the like can be made to flow through the air flow path of air supply device 84.

Figure 7:
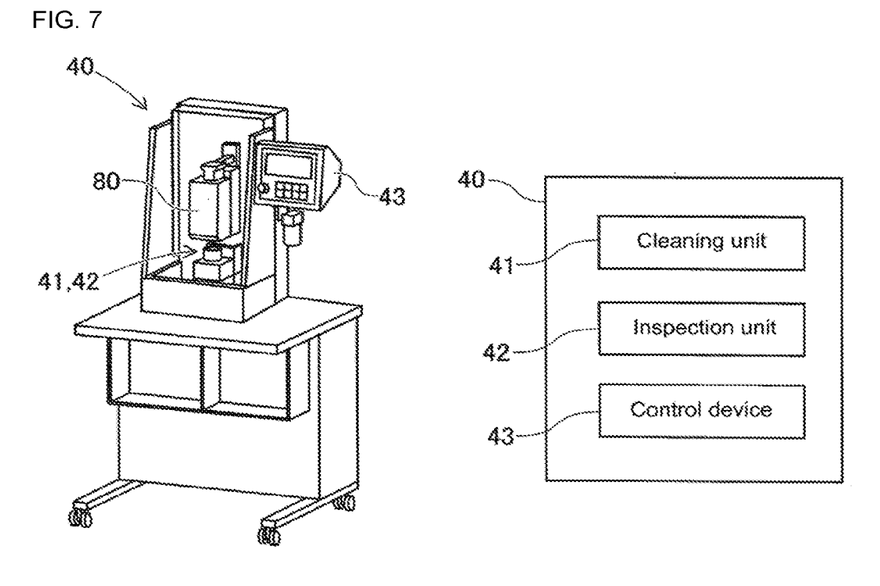
FIG. 7 is a view showing the appearance of a head cleaner and a functional block of the head cleaner.

As shown in FIG. 7, head cleaner 40 includes cleaning unit 41, inspection unit 42, and control device 43. Cleaning unit 41 cleans negative pressure flow path 841 and positive pressure flow path 842 of air supply device 84 in mounting head 80. More specifically, in the cleaning process, cleaning unit 41 supplies cleaning fluid composed of positive pressure air or oil mist to the air flow path of mounting head 80. In the cleaning process, cleaning unit 41 properly operates tool driving device 83 and air supply device 84 while supplying the cleaning fluid.

More specifically, cleaning unit 41 operates Z-axis driving section 833 of tool driving device 83 in a state in which the cleaning fluid is supplied to raise and lower the nozzle shaft holding suction nozzle 70 and operates valve 843 of air supply device 84 to switch the flow path of the cleaning fluid. The type of the cleaning fluid supplied in the cleaning process, the supply amount, and operation of tool driving device 83 and air supply device 84 at the time of supply are properly set according to the type of cleaning.

Inspection unit 42 is an inspection device for performing various inspections on mounting head 80 in head cleaner 40. In the present embodiment, as shown in Table 1 of FIG. 8, the items of inspection by inspection unit 42 include the drive load of the driving sections (R-axis driving section 831, θ-axis driving section 832, Z-axis driving section 833) of mounting head 80, the flow rate of negative pressure flow path 841, and the flow rate of positive pressure flow path 842. More specifically, inspection unit 42 instructs, for example, the driving section of mounting head 80 to perform a defined operation and inspects the drive load of the driving section based on the required time of the operation. In this way, the degree of contamination of the driving section is checked.

Figure 8:
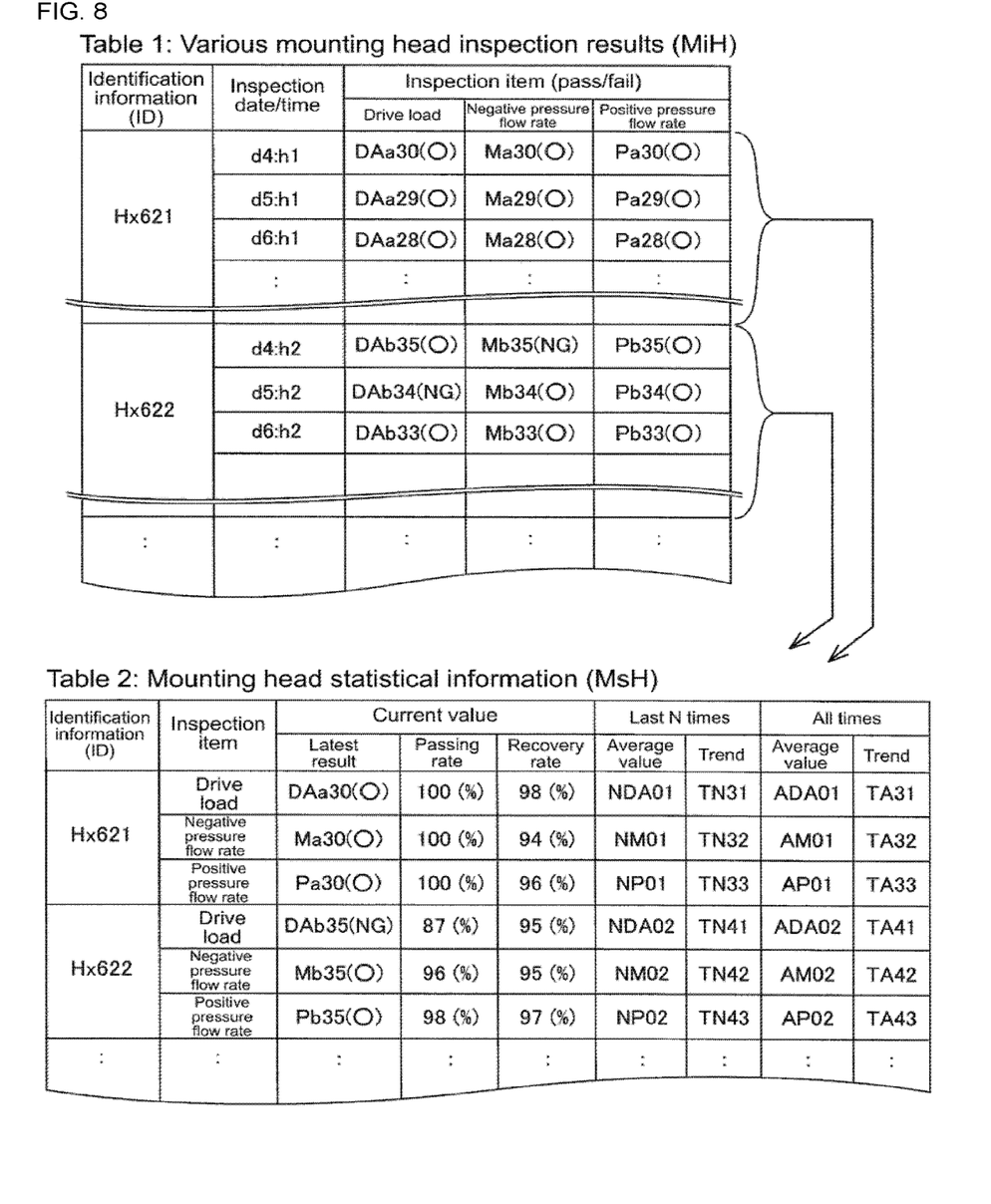
FIG. 8 is tables showing results of various inspections on mounting heads and statistical information, in which the inspection results are linked to identification information for the mounting heads.

Further, inspection unit 42 supplies negative pressure or positive pressure to the air flow path of mounting head 80 and measures the flow rate of air in negative pressure flow path 841 and positive pressure flow path 842 with a flow rate measurement sensor (not shown). In the inspection process, inspection unit 42 tests whether the flow rate in various states is suitable by rotating nozzle tool 82 around the R-axis in a state in which negative pressure or positive pressure is supplied, rotating the nozzle shaft holding suction nozzle 70 around the θ-axis, or raising or lowering the nozzle shaft in the Z-axis direction. When the flow rate in the air flow path of mounting head 80 is decreased, it is assumed that the air flow path is contaminated or the lubricating property of the movable section has deteriorated.

Inspection unit 42 makes a good-bad quality determination in each inspection and records the quality level in the results of the good-bad quality determination. Further, inspection unit 42 may perform a suitable type of inspection on mounting head 80 cleaned with cleaning unit 41 and may re-perform a good-bad quality determination. Specifically, as shown in Table 1 of FIG. 8, inspection unit 42 records the inspection date and time (d4:h1, d5:h1, . . . ) and the measured values of the respective inspection items for each piece of identification information (ID: Hx621, Hx622, . . . ) of mounting head 80 that is the target of inspection.

For example, the measured values (DAa30, DAa29, . . . ) of the drive load of the driving section of mounting head 80 indicate the drive load of R-axis drive section 831 and the like. The drive load of the driving section includes the drive load of θ-axis driving section 832 and Z-axis driving section 833 (not shown), in addition to R-axis driving section 831. Inspection unit 42 records the pass/fail result (O, NG) of each inspection item based on the measured value and the pass/fail criteria. That is, each measured value indicates the quality level in the good/bad quality determination result for the various inspection items.

Control device 43 is a controller mainly composed of a CPU, various types of memory, and a control circuit. Control device 43 is communicably connected to a host PC, which is an external device, and is configured to share various types of information. Control device 43 controls various cleaning processes and various inspection processes. Further, control device 43 acquires the identification information (ID) stored in mounting head 80 by communicating with mounting head 80.

2-4. Maintenance Management Process of Maintenance Management Device 20

As described above, when the "exchangeable element" is "mounting head 80", information management section 22 generates or updates statistical information MsH of mounting head 80 when mounting head 80 is inspected by inspection unit 42 and inspection result MiH (see Table 1 of FIG. 8) is acquired or updated. As a result, as shown in Table 2 of FIG. 8, statistical information MsH statistically shows the results of multiple inspections for each inspection item (i.e., drive load, negative pressure flow rate, positive pressure flow rate) of identification information (Hx621, Hx622, . . . ) of mounting head 80.

In the present modification, information management section 22 links the passing rate, indicating the ratio of the number of passing events to the number of good/bad quality determinations of mounting head 80, and the identification information of mounting head 80 and stores it as statistical information MsH. Mounting head 80 conveyed to head cleaner 40 which fails the good-bad quality determination may pass upon doing the quality determination again after undergoing, for example, a predetermined cleaning process performed by cleaning unit 41.

The passing rate, the recovery rate, the average value and the trend of the last N times, and the average value and the tendency of the total number in statistical information MsH of mounting head 80 correspond to statistical information MsH of suction nozzle 70 exemplified in the embodiment, and therefore detailed description thereof is omitted. Similarly, the maintenance and management process of maintenance and management device 20 is substantially the same as that illustrated in the embodiment in which suction nozzle 70 is an exchangeable element, and therefore, detailed description thereof is omitted. Only the differences will be described below.

Here, in the inspection step (S20) of the maintenance management process in the embodiment, the type of handling for suction nozzle 70 that is an exchangeable element is set (S23), and then suction nozzle 70 is transferred to a corresponding pallet (S24). On the other hand, since head cleaner 40 for mounting head 80 does not have a storage container for storing mounting head 80, the transfer process S24 of the exchangeable element is omitted.

In addition, the type of handling set in S23 may include, as a repair of mounting head 80 which is an exchangeable element, a repair accompanied by exchanging of an exchangeable element constituting mounting head 80. Therefore, in S25, maintenance management device 20 determines that mounting head 80 is to be repaired based on statistical information MsH in S23 and determines whether the number of exchangeable components in stock required for the repair is less than a predetermined value (S25). When the number in stock is less than the predetermined value (S25: Yes), maintenance management device 20 transmits information on the shortage of exchangeable components (S26). Further, the exchangeable elements may be automatically ordered by using the above-mentioned shortage information.

3. Second Alternative Embodiment 3-1. Overview of Second Alternative Embodiment

In an embodiment above, a configuration in which an exchangeable element of component mounting machine 10 targeted by maintenance management device 20 is suction nozzle 70 was described as an example. On the other hand, the exchangeable element of component mounting machine 10 targeted by maintenance management device 20 may be feeder 90. Hereinafter, a second modification in which the "exchangeable element" is "feeder 90" will be described.

3-2. Configuration of Feeder 90

Figure 9:
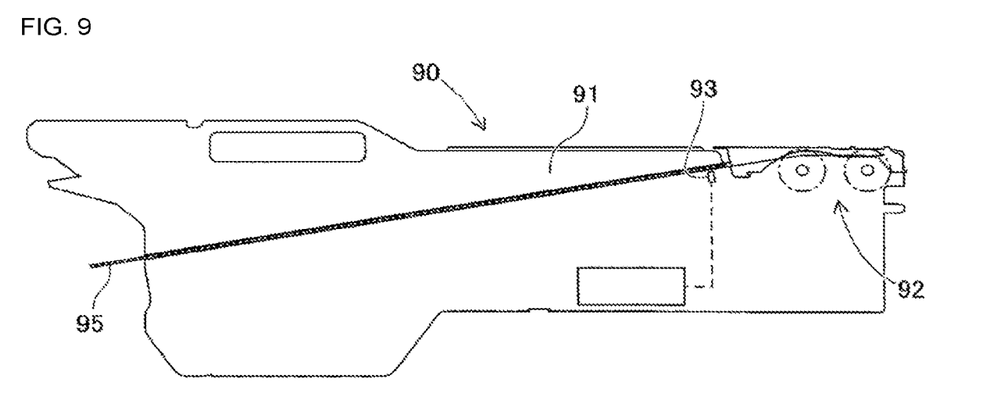
FIG. 9 is a side view of a tape feeder used in a component mounting machine.

As shown in FIG. 9, feeder 90 includes feeder main body 91, driving device 92, and tape sensor 93. Feeder main body 91 is set in slot 121 of component supply device 12. Feeder main body 91 has a rail for supporting inserted carrier tape 95. Driving device 92 is disposed at the front of feeder main body 91 configured to feed components so that the components can be picked up. Driving device 92 has multiple sprockets provided below feeder body 91.

Each of the multiple sprockets engages with an engagement hole in tape 95. Driving device 92 rotates a stepping motor (not shown), as a driving source, to rotate multiple sprockets by a predetermined amount in a predetermined direction. Thus, feeder 90 is configured to feed and move tape 95 along the rail of feeder main body 91.

In this modification, tape sensor 93 detects the bonding portion of tape 95. Feeder 90 is of a type in which tape ends of multiple tapes 95 are bonded to each other to prevent interruption of the supply of components due to breakage of components. As described above, in the splicing process for bonding the tape ends, for example, a metal bonding member is used. Tape sensor 93 detects that the bonding member (i.e., the bonding portion of tape 95) has passed a predetermined position on the rail of feeder main body 91 by detecting a change in capacitance with a detecting section.

Feeder 90 is of a type in which, when tape 95 is inserted into an insertion portion for tape 95 located at a rear portion of feeder main body 91, tape 95 is fed and moved toward the component pickup side to autoload tape 95. In the case of such an autoloading type, a driving device similar to driving device 92 described above is provided below the rail near the insertion portion. In the case of the autoloading type, tape sensor 93 can be used to detect the presence or absence of tape 95 and the end of the tape.

3-3. Configuration of Feeder Maintenance Device 50

As shown in FIG. 1, feeder maintenance device 50 is a device external to component mounting machine 10. In this modification, feeder maintenance device 50 conveys in feeder 90, with its cover removed, and performs cleaning, adjustment, and inspection on feeder 90. When feeder 90 is conveyed in, feeder maintenance device 50 operates driving device 92 of feeder 90 and is able to acquire the detection value of tape sensor 93. Feeder maintenance device 50 includes cleaning unit 51, inspection unit 52, adjustment unit 53, and control device 54.

Figure 10:
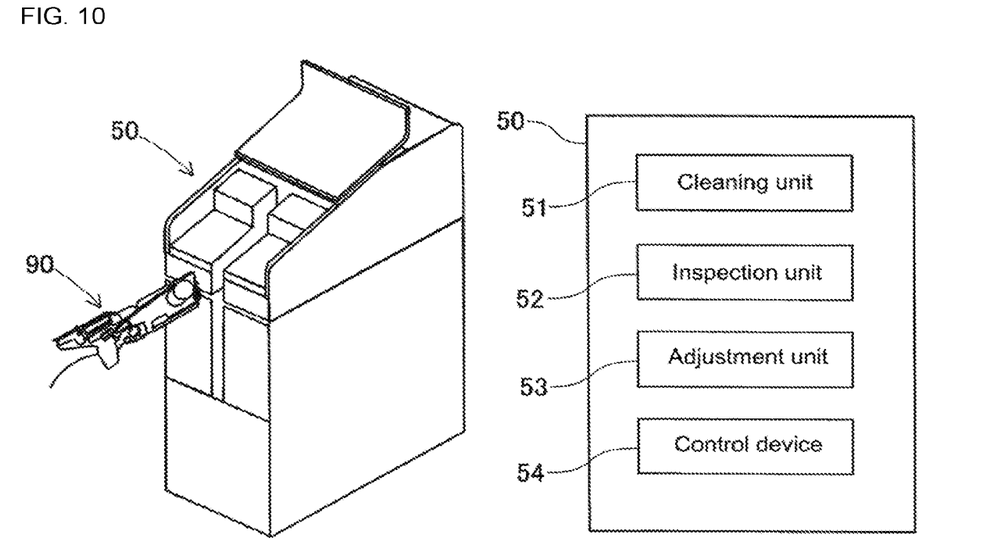
FIG. 10 is a view showing the appearance of a feeder maintenance device and a functional block diagram of the feeder maintenance device.

Cleaning unit 51 cleans driving device 92 of feeder 90 and the detecting section of tape sensor 93. More specifically, in the cleaning process, cleaning unit 51 blows air onto the sprockets or the like of driving device 92 to remove foreign matter such as dust. In addition to the sprockets of driving device 92, cleaning targets include transmission mechanisms such as a gear for transmitting the rotational force of the driving source to the sprockets, and a roller (not shown) for assisting the feeding movement of tape 95. Further, in the cleaning process, cleaning unit 51 sprays washing liquid to the engaging portion of the gear in driving device 92 and removes old lubricant adhering to the engaging portion. The type of cleaning fluid (air, washing liquid) used in the cleaning process, the supply amount, and the cleaning location are properly set according to the type of cleaning.

Inspection unit 52 is an inspection device that performs various inspections on feeder 90 in feeder maintenance device 50. In the present modification, the items of inspection of inspection unit 52 include the operation accuracy of driving device 92 of feeder 90, the drive load of driving device 92, and the detection sensitivity of tape sensor 93, as shown in Table 1 of FIG. 11. More specifically, inspection unit 52 operates, for example, driving device 92 of feeder 90 and detects the operation accuracy and the drive load of driving device 92 based on the actual amount by which tape 95 and a master tape for inspection are fed and moved and the torque required for the operation. As a result, the degree of contamination, lubricity, and the like of driving device 92 can be checked.

Figure 11:
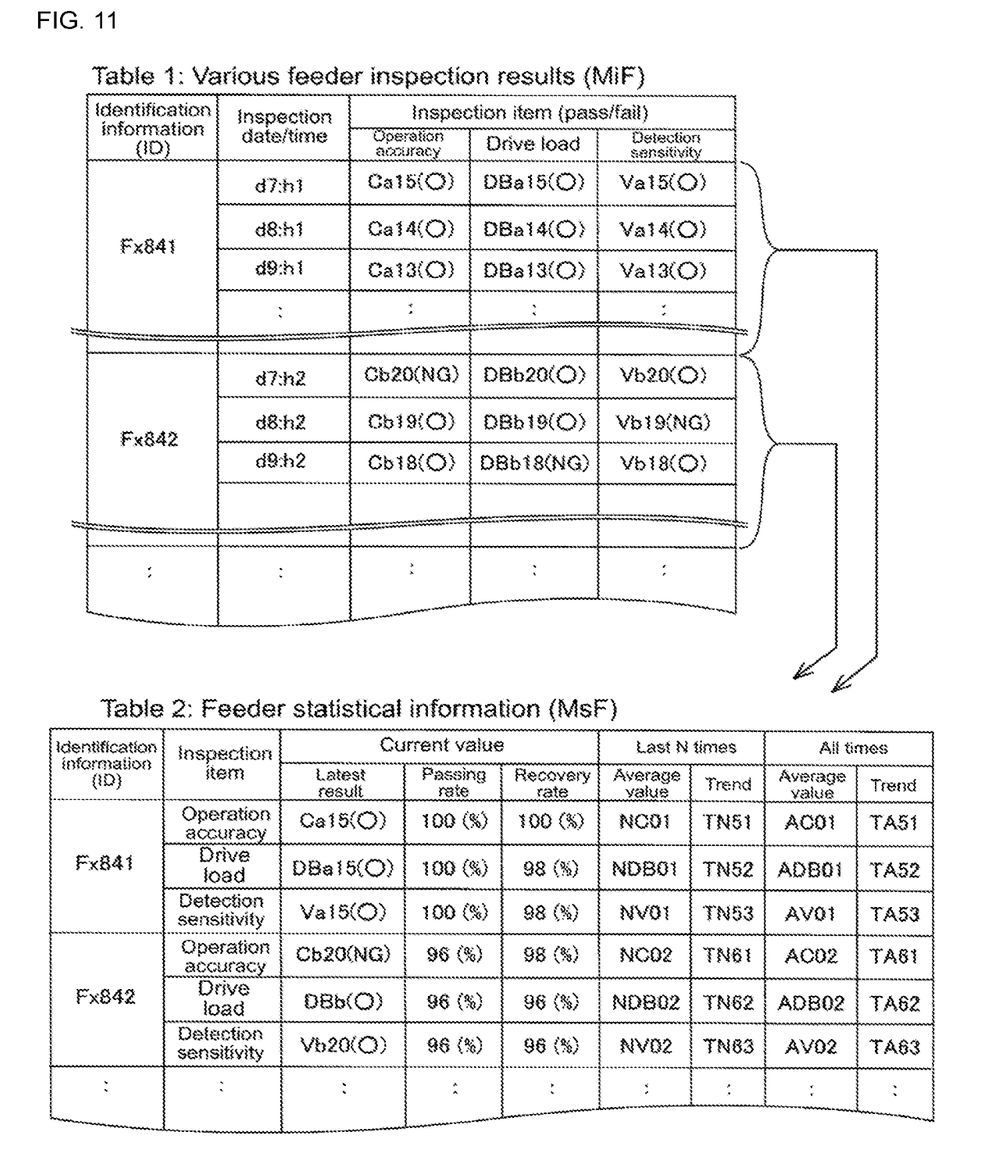
FIG. 11 is tables showing the results of various inspections on tape feeders and statistical information, in which the inspection results are linked to identification information for the tape feeders.

Further, inspection unit 52 causes tape sensor 93 to detect a metal object in order to measure the detection sensitivity of tape sensor 93. Thus, when tape sensor 93 cannot normally detect the bonding portion of tape 95, it is assumed that dirt is adhered onto the detection section of tape sensor 93.

Inspection unit 52 makes a quality determination in each inspection and records the quality level in the good-bad quality determination results. Further, inspection unit 52 may perform a suitable type of inspection on feeder 90 cleaned with cleaning unit 51 or feeder 90 adjusted with adjustment unit 53 described later, and may re-perform the good-bad quality determination. Specifically, as shown in Table 1 of FIG. 11, inspection unit 52 records the inspection date and time (d7:h1, d8:h1, . . . ) and the measured values of the respective inspection items for each piece of identification information (ID: Fx841, Fx842, . . . ) of feeders 90 that are inspection targets.

For example, a measured value (Ca15, Ca14, . . . ) of the operating accuracy of driving device 92 of feeder 90 indicates a deviation in the actual amount of movement of tape 95 relative to the amount of operation of the driving source in driving device 92. Inspection unit 52 records the pass/fail result (O, NG) of each inspection item based on the measured value and the pass/fail criteria. That is, each measured value indicates the quality level in the good/bad quality determination result for the various inspection items.

Adjustment unit 53 adjusts driving device 92 of feeder 90 and the like. More specifically, in the adjustment process, adjustment unit 53 calculates a correction value of the instructed operating amount to the drive source in accordance with the angle of the sprocket with respect to feeder main body 91 in order to rotate the sprockets of driving device 92 by a fixed amount to accurately pitch-feed tape 95. Further, in the adjustment process, adjustment unit 53 supplies lubricant to the engaging portion of the gear in driving device 92. The type, supply amount, and supplying location of the lubricant used in the adjustment process are suitably set according to the type of adjustment.

Control device 54 is a controller mainly composed of a CPU, various types of memory, and a control circuit. Control device 54 is communicably connected to a host PC, which is an external device, and is configured to share various types of information. Control device 54 controls various cleaning processes and various inspection processes. Further, control device 54 acquires the identification information ID stored in feeder 90 by communicating with feeder 90.

3-4. Maintenance Management Process of Maintenance Management Device 20

As described above, when the "exchangeable element" is "feeder 90", information management section 22 generates or updates statistical information MsF of feeder 90 when feeder 90 is inspected by inspection unit 52 and inspection result MiF (see Table 1 of FIG. 11) is acquired or updated. As a result, as shown in Table 2 of FIG. 11, the statistical information MsF statistically shows the results of multiple inspections for each inspection item (i.e., operation accuracy, drive load, and detection sensitivity) of identification information (Fx841, Fx842, . . . ) of feeder 90.

In the present modification, information management section 22 links the passing rate, indicating the ratio of the number of passing events to the number of good-bad quality determinations of feeder 90, and the identification information of feeder 90 and stores it as statistical information MsF. Feeder 90 conveyed into feeder maintenance device 50 which fails the good-bad quality determination may pass upon doing the good-bad quality determination again after undergoing, for example, a predetermined cleaning process performed by cleaning unit 51 or a predetermined adjustment process performed by adjustment unit 53.

The passing rate, the recovery rate, the average value and the trend of the last N times, and the average value and the tendency of the total number in statistical information MsF of feeder 90 correspond to statistical information MsF of suction nozzle 70 described in an embodiment above, and therefore detailed description thereof is omitted. Similarly, the maintenance management processing by the maintenance management device 20 described above is substantially the same as that illustrated in the first alternative embodiment in which mounting head 80 is an exchangeable element, and therefore, detailed description thereof is omitted.

4. Other Alternatives

In the first and second alternative embodiments, maintenance management device 20 has a configuration in which information management section 22 is incorporated in the host PC. On the other hand, information management section 22 may be incorporated in a device (30, 40, 50) including an inspection device (i.e., inspection units 32, 42, 52). In the configuration in which information management section 22 is embedded in each device, each of the devices may coordinately form a single maintenance management device 20, or each of the devices may operate independently.

Further, inspection unit 32, 42, 52 may have a configuration in which at least a portion of the function is incorporated in a production device such as a component mounting machine. For example, in the case where mounting head 80 is provided with a pressure sensor for measuring air pressure in the air flow path, maintenance management device 20 may measure the flow rate of air in negative pressure flow path 841 and positive pressure flow path 842 using the pressure sensor. Maintenance management device 20 may image suction nozzle 70 using component camera 15 or board camera 16 and inspect the external shape of suction nozzle 70 based on the image data acquired by the imaging.

Further, for example, in the case where a load cell for calibration is provided inside the component mounting machine in order to achieve a suitable pressing force at the time of mounting the component to the board with suction nozzle 70, maintenance management device 20 may measure the sliding resistance of suction nozzle 70 with the load cell.

Further, cleaning units 31, 41, 51 may have a configuration in which at least some of the portions are incorporated in a production device such as a component mounting machine. For example, when positive pressure air is supplied to mounting head 80 of the component mounting machine, maintenance management device 20 may supply this air as a cleaning fluid to mounting head 80 and suction nozzle 70 held by mounting head 80, and may clean the air flow path formed in mounting head 80 or the negative pressure flow path of suction nozzle 70. The inspection process and the cleaning process in the production device as described above can be suitably executed during the continuous production process, for example, the mounting process of the component mounting machine. Further, existing equipment can be used for the inspection and cleaning processes in the production device, thereby reducing equipment costs. Note, however, that a dedicated inspection unit or cleaning unit may be provided in the production device.

The exchangeable element targeted by maintenance management device 20 is suction nozzle 70 in the main embodiment, mounting head 80 in the first alternative embodiment, and feeder 90 in the second alternative embodiment. On the other hand, in maintenance management device 20, as described in the main embodiment, as long as it is a member targeted for inspection which is set in component mounting machine 10 in an exchangeable manner, nozzle station 14, nozzle tool 82, the tool station, and a working head (i.e., inspection head, adhesive application head) other than mounting head 80 may be used as a exchangeable element.

In an embodiment above, statistical information (MsN, MsH, MsF) includes passing rates, recovery rates, average values, and trends. On the other hand, various types of information can be added to statistical information MsN, MsH, MsF as long as the information is further linked to the identification information of the exchangeable element. Specifically, information indicating mounting conditions (moving speed, number of times of use, frequency of use, etc.) at the time when the exchangeable element is used in the mounting process, the management state and supplier of the exchangeable element, the operator or timing of setting the exchangeable element in component mounting machine 10, the type of maintenance executed in the past, the operator who performed the maintenance, and the like are assumed.

By adding the above-described information to the statistical information MsN, MsH, MsF, for example, when any defect occurs, it is possible to assist the determination of the cause of the defect based on the information common to the exchangeable elements in which a similar defect occurs. As a result, when the cause of the defect is determined, it is possible to prevent the occurrence of mounting errors by changing the mounting conditions or the like. As described above, maintenance management device 20 can improve the management of maintenance by statistically managing various types of information. As a result, it is possible to prevent the occurrence of mounting errors and maintain production efficiency.

5. Effects of Configurations of Embodiments

The above-mentioned maintenance management device 20 includes an inspection device (inspection units 32, 42, 52, etc.) for inspecting the exchangeable element (suction nozzle 70, mounting head 80, feeder 90, etc.) in component mounting machine 10 for mounting a component on board Bd, and information management section 22 for storing statistical information MsN, MsH, MsF in which the results of multiple inspections with the inspection device are linked to identification information of multiple exchangeable elements targeted for inspection.

With such a configuration, the inspection results from inspection unit 32 are stored as statistical information MsN, MsH, MsF in association with the identification information (ID) of the corresponding exchangeable element (i.e., suction nozzle 70, mounting head 80, feeder 90, etc.). Such statistical information MsN, MsH, MsF is useful information that can be used for analyzing the performance level of the exchangeable element and trends of change in the performance level of the exchangeable element in identifying the cause of a mounting error. For example, when a trend of a change in the performance level of a certain exchangeable element is observed, it can be used as material for determining whether the exchangeable element can be used for the mounting process. As a result, maintenance can be managed to maintain production efficiency.

REFERENCE SIGNS LIST

10: Component mounting machine, 20: Maintenance management device, 21: Storage device, 22: Information management section, 30: Nozzle cleaner, 31: Cleaning unit, 32: Inspection unit, 33: Nozzle stocker, 331: General area, 332: Management area, 34: Nozzle moving device, 35: Control device, 36: Discharge box, 40: Head cleaner, 41: Cleaning unit, 42: Inspection unit, 43: Control device, 50: Feeder maintenance device, 51: Cleaning unit, 52: Inspection unit, 53: Adjustment unit, 54: Control device, 70: Suction nozzle, 71: Body shaft, 72: Flange, 73: Nozzle shaft, 74: Identification code, 80: Mounting head (exchangeable element), 81: Head main body, 82: Nozzle tool, 83: Tool driving device, 831: R-axis driving section, 832: θ-axis driving section, 833: Z-axis driving section, 84: Air supply device, 841: Negative pressure flow channel, 842: Positive pressure flow channel, 843: Valve, 90: Tape feeder (exchangeable element), 91: Feeder main body, 92: Driving device, 93: Tape sensor, 95: Carrier tape

The invention claimed is:
1. A maintenance management device comprising:
an inspection device configured to inspect an exchangeable element in a component mounting machine configured to mount a component on a circuit board, the inspection device including a camera; and
an information management section configured to
store statistical information in which results of multiple inspections performed by the inspection device are linked to identification information for each of multiple exchangeable elements as a target of the inspection,
determine averages of a plurality of good-bad quality determinations of the exchangeable elements based on the multiple inspections,
determine a passing rate based on the averages for each of the exchangeable elements the passing rate indicating a ratio of passes with respect to a number of good-bad quality determinations of the exchangeable element,
link the passing rate to the identification information of the exchangeable element, and store the linked passing rate and the identification information of the exchangeable element as the statistical information.

2. The maintenance management device of claim 1, wherein the exchangeable element is a suction nozzle configured to be supplied with negative pressure to pick up the component.

3. The maintenance management device of claim 2, wherein items of inspection by the inspection device include at least one of an external shape of the suction nozzle, a flow rate of a negative pressure flow path, and a sliding resistance of an extending-retracting section.

4. The maintenance management device of claim 3, further comprising:
a nozzle cleaner configured to clean the negative pressure flow path or the extending-retracting section of the suction nozzle, wherein
the inspection device is configured to perform the good-bad quality determination again on the suction nozzle cleaned by the nozzle cleaner.

5. The maintenance management device of claim 4, wherein the nozzle cleaner is configured to set at least one of a cleaning type, a cleaning combination, and a number of cleanings of the suction nozzle based on the statistical information.

6. The maintenance management device of claim 2, wherein the information management section is configured to further store, as the statistical information, a recovery rate indicating a current state recovery ratio with respect to a reference state for the exchangeable element based on a quality level determined by results of the good-bad quality determinations of the exchangeable element, linked with the identification information for the exchangeable element.

7. The maintenance management device of claim 1, wherein the exchangeable element is a mounting head configured to hold a suction nozzle that picks up the component and supply the suction nozzle with negative pressure and positive pressure.

8. The maintenance management device of claim 7, wherein items of inspection by the inspection device include at least one of a drive load of a driving section of the mounting head, a flow rate of a negative pressure flow path of the mounting head, and a flow rate of a positive pressure flow path of the mounting head.

9. The maintenance management device of claim 8, further comprising:
a head cleaner configured to clean at least one of the driving section, the negative pressure flow path, and the positive pressure flow path of the mounting head; wherein
the inspection device is configured to perform the good-bad quality determination again on the mounting head cleaned by the head cleaner.

10. The maintenance management device of claim 9, wherein the head cleaner is configured to set at least one of a cleaning type, a cleaning combination, and a number of cleanings for the mounting head based on the statistical information.

11. The maintenance device of claim 1, wherein the exchangeable element is a tape feeder configured to supply the component by feeding carrier tape in which the component is housed, and the inspection by the inspection device includes a good-bad quality determination of the tape feeder.

12. The maintenance management device of claim 11, wherein items of inspection by the inspection device includes at least one of an operation accuracy of a driving device configured to feed the carrier tape, a drive load of the driving device configured to feed the carrier tape, and a detection sensitivity of a tape sensor configured to detect the carrier tape.

13. The maintenance management device of claim 12, further comprising:
a feeder maintenance device configured to clean or adjust the driving device of the tape feeder or a detecting section of the tape sensor; wherein
the inspection device is configured to performs the good-bad quality determination again on the tape feeder cleaned or adjusted by the feeder maintenance device.

14. The maintenance management device of claim 13, wherein the feeder maintenance device is configured to set at least one of a cleaning or adjustment type, a cleaning or adjustment combination, and a number of cleanings or adjustments for the tape feeder that is a target for cleaning or adjustment based on the statistical information.

15. The maintenance device of claim 1, wherein the maintenance device is configured to notify an operator of the identification information and the statistical information of the exchangeable element when the inspection result for the exchangeable element in the statistical information does not satisfy a certain criterion.

16. The maintenance management device according to claim 1, further comprising:
a storage container configured to store multiple of the exchangeable elements, and
a moving device configured to move the exchangeable elements between the inspection device and the storage container,
wherein the storage container is provided with a general area from which an operator can remove the exchangeable elements and a management area from which only an administrator having a predetermined authority can remove the exchangeable elements, and
wherein the maintenance management device is configured to switch the general area or the management area based on the statistical information related to the exchangeable elements when the moving device moves the exchangeable elements from the inspection device to the storage container.

17. The maintenance management device of claim 1, wherein the maintenance management device is configured to determine that the exchangeable element is to be discarded based on the statistical information, and transmit information relating to a shortage of the exchangeable elements when a number of a substitutable type of exchangeable element in stock is less than a predetermined value, or
the maintenance management device is configured to determine that the exchangeable element is to be repaired based on the statistical information, and transmit information relating to the shortage of the exchangeable elements when a number of the exchangeable elements for which repair is required is less than a predetermined value.

\* \* \* \* \*